United States Patent [19]

Fiore et al.

[11] Patent Number: 4,784,881

[45] Date of Patent: Nov. 15, 1988

[54] PROCESS FOR THE ADHESION OF POLY-P-XYLYLENE TO SUBSTRATES BY MEANS OF PHOSPHORIC ACID ESTER PRIMERS

[75] Inventors: Leonardo Fiore, Milan; Aldo Cicuta, Novara, both of Italy

[73] Assignee: Montedison S.p.A, Milan, Italy

[21] Appl. No.: 940,792

[22] Filed: Dec. 12, 1986

[30] Foreign Application Priority Data

Dec. 19, 1985 [IT] Italy .................... 23300 A/85

[51] Int. Cl.$^4$ .............................................. C23C 16/02
[52] U.S. Cl. .................... 427/255.6; 427/255; 427/385.5; 427/388.1; 427/389.7; 427/393.5; 427/407.1; 427/409
[58] Field of Search .............. 427/255.6, 299, 255, 427/302, 407.1, 58, 385.5, 388.1, 393.5, 409, 389.7; 428/483, 411.1, 520, 426, 457

[56] References Cited

U.S. PATENT DOCUMENTS

| | | | |
|---|---|---|---|
| 2,785,090 | 3/1957 | Kirk | 427/255.6 |
| 3,379,803 | 4/1968 | Tittmann et al. | 427/255.6 |
| 3,397,085 | 8/1968 | Cariou et al. | 427/255.6 |
| 3,573,968 | 4/1971 | Loeb et al. | 427/255.6 |
| 3,753,773 | 8/1973 | Lee | 427/255.6 |
| 3,901,994 | 8/1975 | Mehalso | 427/255.6 |
| 3,908,046 | 9/1975 | Fitzpatrick et al. | 427/255.6 |
| 3,957,918 | 5/1976 | Dickle et al. | 427/407.1 |
| 4,039,722 | 8/1977 | Dickle et al. | 427/407.1 |
| 4,291,244 | 9/1981 | Beach et al. | 427/255.6 |
| 4,299,866 | 11/1981 | Clark et al. | 427/255.6 |
| 4,495,889 | 1/1985 | Riley | 427/255.6 |
| 4,518,623 | 5/1985 | Riley | 427/255.6 |

FOREIGN PATENT DOCUMENTS

| | | | |
|---|---|---|---|
| 1439826 | 1/1973 | Fed. Rep. of Germany | 427/255.6 |
| 50-3973 | 1/1975 | Japan | 427/255.6 |
| 53-23360 | 7/1978 | Japan | 427/255.6 |

OTHER PUBLICATIONS

Acitelli et al, "Surface Priming to Enhance Adhesion to Silicone Elastomer", IBM Tech. Discl. Bulletin, vol. 16, No. 3, Aug. 1973.

Primary Examiner—Sadie Childs
Attorney, Agent, or Firm—Stevens, Davis, Miller & Mosher

[57] ABSTRACT

Process for the adhesion of para-xylylene vapors to solid substrates by the use of an unsaturated ester of phosphoric acid of the formula:

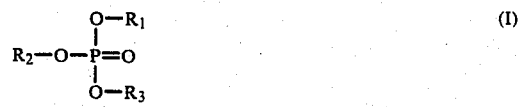

wherein at least one of the radicals $R_1$, $R_2$ and $R_3$ is hydrogen and at least one of said radicals is:

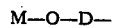

with M being a methacrylyl or acrylyl radical and D a straight or branched alkylene radical containing 2 to 6 carbon atoms, optionally halogen-substituted.

7 Claims, No Drawings

PROCESS FOR THE ADHESION OF POLY-P-XYLYLENE TO SUBSTRATES BY MEANS OF PHOSPHORIC ACID ESTER PRIMERS

DESCRIPTION OF THE INVENTION

This invention relates to a process for the adhesion of poly-p.xylylene and derivatives thereof to solid substrates.

More particularly, the invention relates to the use of adhesion promoters in order to cause poly-p.xylylene and derivatives thereof to adhere to various substrates.

As is known for the coating of solid substrates to be utilized in the electronic and electrotechnic fields, use is made of poly-p.xylylene or of its derivatives prepared by polymerization in situ of (2,2)-paracyclophane or derivatives thereof of the formula:

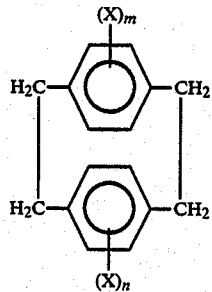

(II)

wherein X may be a halogen, preferably chlorine, an alkyl, an aralkyl or a halogen-aralkyl radical, and m and n may be an integer from 0 to 4, according to the per se well known vacuum vapor deposition technique.

An important problem encountered in the application of (2,2)-paracyclophane or derivatives thereof of formula (II) resides in the difficulty in obtaining a perfect and homogeneous adhesion of the corresponding polymer of p.xylylene to the substrate to be coated. Actually, the adhesion of the p.xylylene polymers to very different surfaces to be coated, such as metallic, plastic, ceramic surfaces and the like, is not entirely satisfactory. The problem of good adhesion is particularly important in the case of substrates to be utilized in electronics, where the adhesion of the p.xylylene polymers not only must be perfect, but also must be attained without interfering with the (2,2)-paracyclophane deposition process, while at the same time maintaining unaltered the electric and electronic properties of the substrates.

Thus, for example, the use of adhesives applied by spreading from a solvent do not offer a satisfactory solution of the problem because they adversely affect the vacuum vapor deposition processes.

To solve this problem it has also been suggested to use an adhesion promoter capable of acting as a "bridge" between the substrate surface and the p.xylylene polymer. However, the known adhesion promoters lead to satisfactory results only with a few types of substrates to be coated, wherefore the most suitable type of promoter has to be selected for the particular occasion.

According to the present invention, it has now been found that the p.xylylene polymers may be made to adhere to any type of substrate by using, as an adhesion promoter, an unsaturated ester of phosphoric acid having the formula:

wherein at least one of the radicals $R_1$, $R_2$ and $R_3$ is hydrogen and at least one of said radicals is:

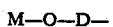

with M being a methacrylyl or acrylyl radical and D is a straight or branched alkylene radical containing 2 to 6 carbon atoms, optionally halogen-substituted.

Said unsaturated esters of phosphoric acid having formula (I) not only adhere perfectly to any solid substrate, but also act as adhesion promoters for the p.xylylene vapors which, after deposition onto the substrate surface, form a polymer.

The present invention relates also to the substrate treated with a phosphoric acid unsaturated ester of formula (I) and coated with a p.xylylene polymer according to the vapor vacuum deposition technique.

The divalent radicals of p.xylylene or derivatives thereof may be prepared by pyrolysis, at a temperature higher than 400° C., of (2,2)-paracyclophane or of a derivative thereof of formula (II), thus generating vapors of reactive radicals of formula:

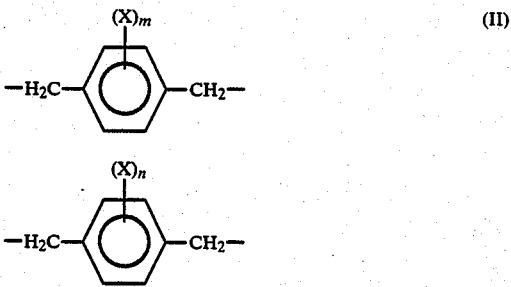

wherein X, m and n are the same as defined above.

When m and n are the same and the substituents on each ring are the same, two moles of the same p.xylylene radical are formed, which, by condensation, give rise to a substituted or non-substituted p.xylylene homopolymer. Conversely, when m and n are different or when substituents X in each radical are different, their condensation leads to p.xylylene copolymers.

The divalent p.xylylene radicals condense and polymerize almost instantaneously on the substrate, thereby forming a compact and homogeneous coating film.

Illustrative examples of phosphoric acid unsaturated esters of formula (I) which are useful as adhesion promoters in the present invention are: methacryl-ethyl phosphate, acryl-ethyl phosphate, dimethacrylethyl phosphate, diacrylethyl phosphate, methacrylpropyl phosphate, acrylpropyl phosphate, dimethacrylpropyl phosphate, methacrylethyl-methacrylpropyl phosphate, etc. Among these, methacrylethyl phosphate is preferred.

The phosphoric acid unsaturated esters of formula (I) are applied to the substrate as a solution. The solvent may vary as a function of the utilized ester. Suitable solvents may be: water; an alcohol having a low number of carbon atoms, such as methyl alcohol, ethyl alcohol, isopropyl alcohol, etc.; a halogenated hydrocarbon such as trichloroethylene; water-methyl alcohol, water-isopropyl alcohol, etc., in any volumetric ratio.

In the solution, the amount of phosphoric acid unsaturated ester of formula (I) may range from 0.05 to 50% by weight, depending on the utilized solvent. The preferred concentrations are those between 0.1 and 5% by weight.

The substrate may be treated with such solutions according to per se conventional techniques such as direct immersion of the substrate into the solution, or by means of spraying, etc.

The solvent is then removed from the substrate by evaporation at room temperature or at higher temperatures, depending on the characteristics of the employed solvent.

The substrate to be coated according to the present invention may be any solid of an organic or inorganic nature, and which can assume any geometrical shape, such as foils, fibers, particles, and the like. The substrate is subjected to washing and to degreasing before undergoing the process of the present invention.

Illustrative examples of organic or inorganic substrates are: metal substrates such as those of aluminum, iron, copper, steel, molybdenum, etc.; substrates of metallic and nonmetallic oxides such as those of aluminum, titanium, lead, copper, beryllium, manganese, tungsten, vanadium, etc., and silicon oxides; organic solid substrates include such as the epoxy compounds and thermoplastic and thermosetting compounds of different compositions.

For the generation and the deposition of the vapors of reactive divalent radicals of p.xylylene onto the treated surface of a substrate, one may use any per se known apparatus such as that described for example in Kirk-Othmer's Encyclopaedia of Chemical Technology, Third Edition, Vol 24, pages 746–747 (1984).

Generally, said apparatus comprises a chamber suited for containing the substrate to be coated, which is maintained at a temperature below 200° C. or in general below the condensation temperature of the particular type of p.xylylene utilized. Said chamber is in communication with a vaporization-pyrolysis furnace through a labyrinthine passage. The furnace is maintained at a temperature which is high enough to cause the evaporation and pyrolysis of (2,2)-paracyclophane or derivatives thereof. Said (2,2)-paracyclophane or derivative thereof is left in the furnace over such period of time as is sufficient for the evaporation and the pyrolysis to take place in order to form the corresponding divalent radicals of p.xylylene. These radicals pass to the deposition chamber and polymerize when coming into contact with the surface of a substrate prepared according to the process of the present invention, thus forming a coating film consisting of the p.xylylene polymer or of a derivative thereof.

It has been found that when operating according to the process of this invention, the p.xylylene polymers exhibit an improved adhesion to the substrate at room temperature and, after treatment in water, both at room temperature and at a higher temperature, with respect to the adhesion attained with the same substrate untreated.

The invention is still further elucidated by the following examples, which are to be construed as merely illustrative and not limitative of the scope of the invention.

EXAMPLE 1

A substrate consisting of an epoxy resin foil having a copper printed circuit was degreased by immersion in isopropyl alcohol for about 10 minutes. The substrate was then dried in air to remove the solvent.

A solution was prepared by dissolving 5 g of methacrylethyl phosphate (a product placed on the marked by AKZO under the trademark NOURYCRYL MP 12) in 500 cc of ispropyl alcohol and 500 cc of distilled water. The solution was allowed to stand overnight. The substrate was immersed into the solution and left there during 30 minutes, then it was dried in air for 30 minutes and in hot air at 70° C. during a futher 30 minutes.

The substrate was then placed in the vapor deposition chamber of an apparatus for the polymerization of dichloro-(2,2)-paracyclophane. 100 g of dichloro-(2,2)-paracyclophane were evaporated at 185° C. and 50 mm of Hg. The vapors were heated in a quartz tube at 665° C. in order to pyrolize the dichloro-(2,2)-paracyclophane and to form the corresponding divalent chloro-p.xylylene radicals. The radicals were introduced into the deposition chamber maintained at a temperature lower than 70° C., where they condensed on the substrate surface to form a poly-p.xylylene film of about 10 $\mu$m thickness.

The adhesion of the film to the substrate, measured according to ASTM D 3359-78, corresponded to classification 5.

The adhesion remained unaltered both under normal atmospheric conditions and after a 24-hour treatment in water at room temperature.

EXAMPLE 2

Example 1 was repeated, but using an aluminum foil as a substrate.

Also in this case, an excellent adhesion of the polychloro-p.xylylene film to the substrate was obtained, with classification 5 according to standard ASTM D 3359-78.

The adhesion remained unaltered under normal atmospheric conditions as well as after a 24-hour treatment in water at room temperature.

EXAMPLE 3

Example 1 was repeated but using a stainless steel foil as a substrate. A perfect adhesion of the film to the substrate was obtained (classification 5), and such adhesion also remained unaltered after a 24-hour treatment in water at room temperature.

EXAMPLE 4

Following the procedures of Example 1, a glass sheet was coated. The adhesion of the poly-chloro-p.xylylene film was excellent and corresponded to classification 5 according to ASTM D 3359-78.

EXAMPLE 5

Operating according to Example 1, a glass sheet was first dipped into an aqueous solution containing 0.5% by weight of methacrylethyl phosphate and then coated with a poly-chloro-p.xylylene film. The adhesion of the poly-chloro-p.xylylene film was excellent and corresponded to classification 5 according to ASTM D 3359-78.

What is claimed is:

1. A process for obtaining the adhesion of p-xylylene polymer to organic or inorganic solid substrates which comprises coating the substrate surface with a compound, as an adhesion promoter, having the formula:

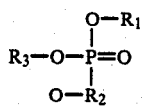

wherein at least one of the radicals $R_1$, $R_2$ and $R_3$ is hydrogen and at least one of said radicals is

M—O—D—

M being a methacrylyl or an acrylyl radical and D being a straight or branched alkylene radical containing from 2 to 6 carbon atoms, optionally halogen-substituted, then contacting said coated substrate with vapors of reactive divalent radicals of p-xylylene or derivatives thereof which polymerize after deposition onto the coated substrate surface.

2. The process according to claim 1, wherein the substrate surface is treated with a solution of a phosphoric acid unsaturated ester having the formula (I).

3. The process according to claim 2, wherein the solvent for the phosphoric acid unsaturated ester having the formula (I) is selected from water, an alcohol having a low number of carbon atoms, a halogenated hydrocarbon, and water-alcohol mixtures.

4. The process according to claim 2 or 3, wherein the solution concentration ranges from 0.05 to 50% by weight, and preferably from 0.1 to 5% by weight.

5. The process according to claim 1 or 2, wherein the phosphoric acid unsaturated ester of formula (I) is methacrylethyl phosphate.

6. The process according to claim 1 or 2, wherein the vapors of divalent radicals of p.xylylene or derivatives thereof are obtained by pyrolysis, at a temperature higher than 400° C., of (2,2)-paracyclophane or derivatives thereof of formula:

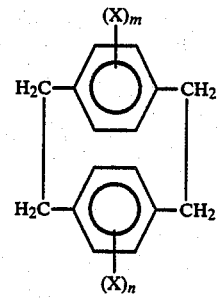

wherein X may be a halogen, an alkyl radical, an aralkyl radical, or a halo-aralkyl radical, and m and n may be an integer from 0 to 4.

7. A process according to claim 6, wherein X is chlorine.

* * * * *